United States Patent
Lee et al.

(10) Patent No.: US 10,298,219 B2
(45) Date of Patent: May 21, 2019

(54) PASS SWITCH CIRCUIT WITH IMPROVED TIME RESPONSE CHARACTERISTICS AND METHOD OF CONTROLLING SAME

(71) Applicant: Silicon Works Co., Ltd., Daejeon (KR)

(72) Inventors: Seung Jong Lee, Gyeonggi-do (KR); Hoo Hyun Cho, Seoul (KR); Young Jin Woo, Daejeon (KR)

(73) Assignee: Silicon Works Co., Ltd., Daejeon (KR)

( * ) Notice: Subject to any disclaimer, the term of this patent is extended or adjusted under 35 U.S.C. 154(b) by 0 days.

(21) Appl. No.: 14/593,632

(22) Filed: Jan. 9, 2015

(65) Prior Publication Data

US 2016/0149568 A1    May 26, 2016

Related U.S. Application Data

(63) Continuation of application No. PCT/KR2014/011446, filed on Nov. 26, 2014.

(51) Int. Cl.
*H03K 17/041* (2006.01)

(52) U.S. Cl.
CPC .......... *H03K 17/04106* (2013.01); *H03K 2217/0054* (2013.01)

(58) Field of Classification Search
CPC ...... H03K 17/00; H03K 17/04; H03K 17/041; H03K 17/04106; H03K 17/04113; H03K 17/0412; H03K 17/04123; H03K 17/04126; H03K 17/0414; H03K 19/00; H03K 19/01; H03K 19/013; H03K 19/0133; H03K 19/0136; H03K 19/017; H03K 19/01707; H03K 19/01714; H03K 19/01721; H03K 19/01728; H03K 19/01735; H03K 19/01742

USPC .......... 327/365, 374–377, 379–391
See application file for complete search history.

(56) References Cited

U.S. PATENT DOCUMENTS

| | | | |
|---|---|---|---|
| 5,160,854 A | | 11/1992 | Martignoni et al. |
| 5,216,290 A | * | 6/1993 | Childers .............. H03K 17/063 327/306 |
| 5,397,967 A | | 3/1995 | Carobolante et al. |
| 5,742,196 A | | 4/1998 | Fronen et al. |
| 5,796,276 A | | 8/1998 | Phillips et al. |
| 6,008,687 A | * | 12/1999 | Orita ........................ G09G 3/20 327/313 |

(Continued)

FOREIGN PATENT DOCUMENTS

| | | |
|---|---|---|
| EP | 0577367 B1 | 1/1994 |
| JP | 2004-242084 A | 8/2004 |

(Continued)

*Primary Examiner* — Lincoln D Donovan
*Assistant Examiner* — Diana J. Cheng
(74) *Attorney, Agent, or Firm* — Mintz Levin Cohn Ferris Glovsky and Popeo, P.C.; Kongsik Kim; Jonathon Western

(57) ABSTRACT

A pass switch circuit for transferring the voltage of an input node to an output node and a method of controlling the pass switch circuit are disclosed herein. The pass switch circuit includes a pass switch, a first capacitor, and a first switch. The pass switch transfers a voltage level from an input node to an output node. The first capacitor is configured such that the node of one side thereof has a first level of voltage when the voltage of the control node of the pass switch is in a first state. The first switch connects the node of the one side of the first capacitor with the control node of the pass switch.

17 Claims, 11 Drawing Sheets

(56) References Cited

U.S. PATENT DOCUMENTS

| | | | |
|---|---|---|---|
| 6,046,577 | A | 4/2000 | Rincon-Mora et al. |
| 6,201,429 | B1 | 3/2001 | Rosenthal |
| 6,522,178 | B2 | 2/2003 | Dubhashi et al. |
| 6,727,742 | B2 | 4/2004 | Mariani et al. |
| 6,784,719 | B2 | 8/2004 | Okamoto et al. |
| 6,809,553 | B2 | 10/2004 | Morini et al. |
| 6,956,411 | B1 * | 10/2005 | Holloway ............... G11C 27/02 327/384 |
| 7,206,228 | B2 | 4/2007 | Park |
| 7,508,247 | B2 | 3/2009 | Tseng et al. |
| 7,683,672 | B2 | 3/2010 | Bartlett |
| 7,750,687 | B2 | 7/2010 | Muhlbacher et al. |
| 7,812,660 | B2 | 10/2010 | Tamura |
| 7,893,730 | B2 | 2/2011 | Jung et al. |
| 8,299,765 | B2 | 10/2012 | Hirano |
| 8,773,095 | B2 | 7/2014 | Gakhar et al. |
| 2007/0075760 | A1 | 4/2007 | Tseng et al. |
| 2013/0033302 | A1 | 2/2013 | Ali |
| 2014/0146429 | A1 | 5/2014 | Lee et al. |

FOREIGN PATENT DOCUMENTS

| | | |
|---|---|---|
| JP | 2009-130879 A | 6/2009 |
| KR | 1996-0010386 | 7/1996 |
| KR | 10-0609576 | 8/2006 |
| KR | 10-2010-0012815 | 2/2010 |
| KR | 10-1211829 | 12/2012 |
| KR | 10-2014-0070752 | 6/2014 |

\* cited by examiner

Related Art

PASS SWITCH CIRCUIT WITH IMPROVED TIME RESPONSE CHARACTERISTICS AND METHOD OF CONTROLLING SAME

CROSS-REFERENCE TO RELATED APPLICATION

This application is a continuation of PCT/KR2014/011446 filed on Nov. 26, 2014, which application is incorporated herein by reference.

TECHNICAL FIELD

The present invention relates to a pass switch circuit that transfers the voltage of an input node to an output node and, more particularly, to a pass switch circuit that has improved time response characteristics, thereby enabling fast switching.

BACKGROUND ART

In electronic circuit applications supporting high-voltage switching operations, a circuit called a level shifter is employed to transfer signals between circuit networks having different voltage levels. A level shifter functions to convert a logic signal operating in a voltage range from 0 to V1 into an output signal operating in a voltage range from 0 to V2 when it is combined with an inverter.

Furthermore, a level shifter also refers to a circuit for simply transferring a voltage level rather than transferring a logic signal. In this case, if a specific logic condition is satisfied, the level shifter transfers a voltage level from an input side to an output side via a pass switch, and then may perform the operation of boosting or stepping down voltage using a circuit, such as a bootstrap or a charge pump.

Examples of the typical circuit of such a high-voltage level shifter are disclosed in U.S. Pat. No. 5,160,854 entitled "Single-Drive Level Shifter with Low Dynamic Impedance" and U.S. Pat. No. 6,727,742 entitled "High-Voltage Level Shifting Circuit with Optimized Response Time."

U.S. Pat. No. 6,727,742 discloses an example of the typical conventional circuit of a high-voltage level shifter, which is illustrated in FIG. 1.

Referring to FIG. 1, a level shifter circuit is illustrated in which an output voltage OUT swings between VBOOT and VPHASE in response to an input control signal φ.

VBOOT, that is, the upper limit of the output voltage VOUT, is high-voltage power that is commonly equal to or higher than 40-50 V, and VPHASE, that is, the lower limit of the output voltage VOUT, is power that has a voltage level lower than VBOOT by a specific difference. Generally, a high-voltage level shifter is widely used in power devices for handling high currents. When a power device is implemented using a semiconductor, a double diffused MOS (DMOS) transistor is widely used.

DMOS transistors are classified into vertical diffusion-type vertical DMOS (VDMOS) transistors and lateral diffusion-type lateral DMOS (LDMOS) transistors. It is known that for both VDMOS and LDMOS transistors, a drain-source breakdown voltage is a high voltage ranging from 40 to 50 V and a gate-source voltage is determined by the thickness of the channel oxide of a corresponding transistor, so that it is very difficult to increase the gate-source voltage to a level of tens of volts.

Accordingly, a high-voltage level shifter is designed not to exceed the limit of a gate-source voltage in order to ensure the safe operation of a DMOS transistor. For example, in FIG. 1, when the limit of the gate-source voltage of the DMOS transistor is 10 V, the difference between VBOOT and VPHASE is determined to be within 10 V.

In order to obtain an electric potential VPHASE having a specific difference with VBOOT, the combination of a resistor R1 and a current source Idd and a clamping circuit M3 are widely used, as illustrated in FIG. 1.

When an input control signal φ is turned on, the current source Idd operates, a switch MHV is turned on, and thus current Idd flows through the switch MHV. In this case, all or part of the current Idd flows through the resistor R1, and thus a difference in voltage between VBOOT and a node X 110 is generated by a voltage drop between both terminals of the resistor R1. Since the voltage of the node X 110 is the voltage Vg of the gate nodes of M1 and M2, M1, that is, a PMOS transistor, is turned on and an output voltage OUT has the voltage level of VBOOT. Meanwhile, when the transistor M3 is turned on, a difference corresponding to the threshold voltage VT,M3 of the transistor M3 is present between the voltage VPHASE of the gate node of M3 and the voltage Vx of the node X 110, that is, the source node of M3. That is, a condition, such as that of Equation 1, is satisfied:

$$Vx = VPHASE - VT, M3 \quad (1)$$

When a potential difference between VPHASE and Vx reaches VT,M3, the transistor M3 is turned off, and thus the current Idd flows only through the resistor R1. In this case, the voltage Vx of the node X 110 satisfies the condition of Equation 2 below:

$$Vx = VBOOT - Idd \cdot R1 \quad (2)$$

As a result, VPHASE, that is, the lower limit of the output voltage OUT, satisfies Equation 3 below:

$$VPHASE = VBOOT - Idd \cdot R1 + VT, M3 \quad (3)$$

That is, it can be seen that the difference between VPHASE, that is, the lower limit of the output voltage VOUT, and VBOOT is determined by the threshold voltage VT,M3 of the current source Idd, the resistor R1 and the transistor M3.

In contrast, when the input control signal φ is turned off, the current source Idd is cut off. In this case, when a sufficient time has elapsed, current flowing through the resistor R1 becomes 0, and thus voltage across both terminals of the resistor R1 becomes 0 V. That is, Vx=VBOOT. In this case, the drain-source voltage of the transistor M3 is 0 V, and current does not still flow through the transistor M3. In this case, since the voltage of Vx is VBOOT, which is high, the transistor M2 is turned on, and the output voltage OUT has the voltage level of VPHASE.

Although the circuit of FIG. 1 will operate in the above-described manner when observed over a long period of time, the circuit is problematic in that in practice, the operation thereof is delayed by the parasitic capacitances Cr and Cp of the node X 110 illustrated in FIG. 1. In this case, Cr denotes the parasitic capacitance of the resistor R1, and Cp denotes the parasitic capacitance of the switch MHV.

When the input control signal φ is turned on in an off state, the voltage Vx of the node X 110 should drop from VBOOT to (VBOOT−Idd·R1), but operates slowly with an RC delay based on a time constant R1·(Cr+Cp) in this process. In the same manner, when the input control signal φ is turned off in an on state, the voltage Vx of the node X 110 should rise from (VBOOT−Idd·R1) to VBOOT, but in this process, Vx slowly reaches a steady state due to the time constant R1·(Cr+Cp).

This means that a transient response is considerably extended. In this case, if Vx has an intermediate level between VBOOT and VPHASE, there is the risk of the voltage of VPHASE changing to a value close to VBOOT for various reasons, such as the event that the transistors M1 and M2 are simultaneously turned on. In order to avoid this problem, the inconvenience of design in which reservoir capacitance corresponding to the node of VPHASE should be very high is incurred.

FIG. 2 is a diagram illustrating an improvement over the circuit of FIG. 1 presented in U.S. Pat. No. 6,727,742.

Referring to FIG. 2, the gate node of a clamping transistor M3 is connected to an output voltage OUT, other than VPHASE. Accordingly, when an input control signal ϕ has been maintained in an on state for a long time, Vx is clamped to VBOOT, that is, the voltage level of the output voltage OUT, other than VPHASE. That is, Equation 4 below is satisfied:

$$Vx = VBOOT - VT,M3 \quad (4)$$

This results in the effect in which the swing range of Vx becomes narrower than Idd·R1 of FIG. 1, and thus the switching speed of the level shifter increases.

However, despite the improved circuit of FIG. 2, a problem still exists in that the node X 110 suffers from a time response delay attributable to an RC time constant.

Furthermore, it is more difficult to match the threshold voltage characteristics of the transistors M1, M2 and M3 in the improved circuit of FIG. 2 than in the circuit of FIG. 1.

As a result, there is a demand for a circuit design technique that is capable of overcoming a time response delay attributable to an RC time constant while effectively protecting a transistor in a high-voltage switching circuit or a level shifting circuit as in the conventional technology.

SUMMARY OF THE DISCLOSURE

Accordingly, the present invention has been made to solve the above problems occurring in the prior art, and the present invention is intended to, in a pass switch circuit, achieve fast time response speed while overcoming an RC delay.

A prior art illustrated in FIG. 2 can reduce time when an input control signal ϕ transitions from an on state to an off state (Vx rises from a low voltage to a high voltage), but cannot be a fundamental solution. Ultimately, this prior art is problematic in that the rise/fall characteristics of Vx are determined by an RC time constant.

Furthermore, the prior art illustrated in FIG. 2 is problematic in that, since the lower limit of Vx is determined to be (VBOOT−VT,M3), a transistor M2 is turned off at the lower limit of Vx only if the threshold voltage VT,M2 of the transistor M2 is considerably high and its intended purpose can be accomplished in this case, for which purpose the condition of the following Equation 5 should be satisfied:

$$VT,M2 > VBOOT - VT,M3 - VPHASE \quad (5)$$

In contrast, a problem arises in that an intended purpose can be accomplished only if a transistor M1 is turned off at the lower limit of Vx, and thus the threshold voltage VT,M1 of the transistor M1 should satisfy Equation 6 below:

$$VT,M1 < VT,M3 \quad (6)$$

That is, the prior art is problematic in that it cannot be a fundamental solution to an RC time delay and also it is very difficult to match the threshold voltage characteristics of the transistors.

The present invention is intended to provide stable and rapid high-voltage switching operation regardless of the characteristics of devices, such as the threshold voltages of transistors, etc., that constitute a circuit.

The present invention is generally intended to improve the time response performance of a pass switch that transfers a voltage level and, more particularly, to improve time response performance while satisfying a low Vgs condition for the protection of a pass switch that transfers a high-voltage level.

The present invention reduces the transient time it takes for a pass switch to reach a desired operation state, thereby reducing leakage current that is generated during the transient time.

The present invention is intended to, when using a pass switch in a charge pump or using a pass switch in place of a diode, reduce the transient time it takes to reach a desired operation state, thereby reducing leakage current and also effectively achieving performance that an application is intended to achieve.

In accordance with an aspect of the present invention, there is provided a pass switch circuit, including a pass switch configured to transfer a voltage level from an input node to an output node; a first capacitor configured such that a node of one side thereof has a first level of voltage when the voltage of the control node of the pass switch is in a first state; and a first switch configured to connect the node of the one side of the first capacitor with the control node of the pass switch.

The pass switch circuit may further include, as a bias circuit for keeping the gate-source voltage of the pass switch circuit constant, a resistor connected between the control node of the pass switch and any one of the input and output nodes; and a current source connected to the control node of the pass switch via the first switch.

The pass switch circuit may further include, as a means for preventing the gate-source voltage of the pass switch circuit from excessively increasing, a clamping circuit connected to the control node of the pass switch and any one of the input and output nodes.

The node of the other side of the first capacitor may be connected to first power supply, and the nodes of both sides of the first capacitor may all have the first level of voltage when the voltage of the control node of the pass switch is in the first state.

When the voltage of the control node of the pass switch is in the first state, the first switch may connect the node of the one side of the first capacitor with the control node of the pass switch, and may change the voltage of the control node of the pass switch from the first state to a second state.

When the first switch connects the node of the one side of the first capacitor with the control node of the pass switch, a process in which the voltage of the control node of the pass switch changes from the first state to a second state may be promoted by charge sharing between a parasitic capacitance of the control node of the pass switch and the first capacitor.

The pass switch circuit may further include a second switch connected to the control node of the pass switch and any one of the input and output nodes; a third switch connected to a control node of the second switch; and a second capacitor configured such that the node of one side thereof is connected to the control node of the second switch via the third switch and the node of the one side of the second capacitor has a second level of voltage when the voltage of the control node of the pass switch is in a second state.

The pass switch circuit may further include a fourth switch configured such that the node of one side thereof is connected to the any one of the input and output nodes to which the second switch is connected, the node of the other side thereof is connected to the control node of the second switch, and a control node thereof is connected to the control node of the second switch.

When the voltage of the control node of the pass switch is in the second state, the third switch may connect the node of the one side of the second capacitor with the control node of the second switch, may change the voltage of the control node of the second switch, and may change the voltage of the control node of the pass switch from the second state to the first state in response to the change in the voltage of the control node of the second switch.

When the third switch connects the node of the one side of the second capacitor with the control node of the second switch, a change in a voltage of the control node of the second switch may be promoted by charge sharing between a parasitic capacitance of the control node of the second switch and the second capacitor, and the voltage of the control node of the pass switch may change from the second state to the first state in response to the change in the voltage of the control node of the second switch.

In accordance with another aspect of the present invention, there is provided a method of controlling a pass switch, including performing control so that the node of one side of a first capacitor has a first level of voltage when the voltage of a control node of a pass switch is in a first state; and connecting the control node of the pass switch with the node of the one side of the first capacitor in response to an input control signal; and changing the voltage of the control node of the pass switch from the first state to a second state.

Changing the voltage of the control node of the pass switch from the first state to the second state may include promoting a process in which the voltage of the control node of the pass switch changes from the first state to the second state by charge sharing between a parasitic capacitance of the control node of the pass switch and the first capacitor.

The method may further include, when the voltage of the control node of the pass switch is in the second state, controlling the pass switch so that the output node of the pass switch has a voltage level based on the voltage level of the input node of the pass switch.

Performing the control so that the node of the one side of the first capacitor has the first level of voltage may include, when the voltage of the control node of the pass switch is in the first state, performing control so that nodes of both sides of the first capacitor all have the first level of voltage.

The method may further include, when the voltage of the control node of the pass switch is in the second state, performing control so that the node of one side of a second capacitor has a second level of voltage; and, in order to activate a second switch connected to the control node of the pass switch and any one of the input and output nodes of the pass switch, performing control so that the node of the one side of the second capacitor is connected with the control node of the second switch by activating a third switch connected to the control node of the second switch.

The method may further include, when the node of the one side of the second capacitor is connected with the control node of the second switch by the third switch, performing control so that the voltage of the control node of the pass switch changes from the second state to the first state due to the activation of the second switch.

Performing the control so that the node of the one side of the second capacitor is connected with the control node of the second switch may include promoting a change in a voltage of the control node of the second switch by charge sharing between the second capacitor and the parasitic capacitance of the control node of the second switch.

The method may further include, when the voltage of the control node of the pass switch changes from the first state to the second state, maintaining a voltage between the control node of the pass switch and a first node, that is, any one of input and output nodes, to be a reference voltage by using a resistor connected between the control node of the pass switch and the first node and a current source connected to the control node of the pass switch in response to the input control signal.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE DISCLOSURE

Figure 1:
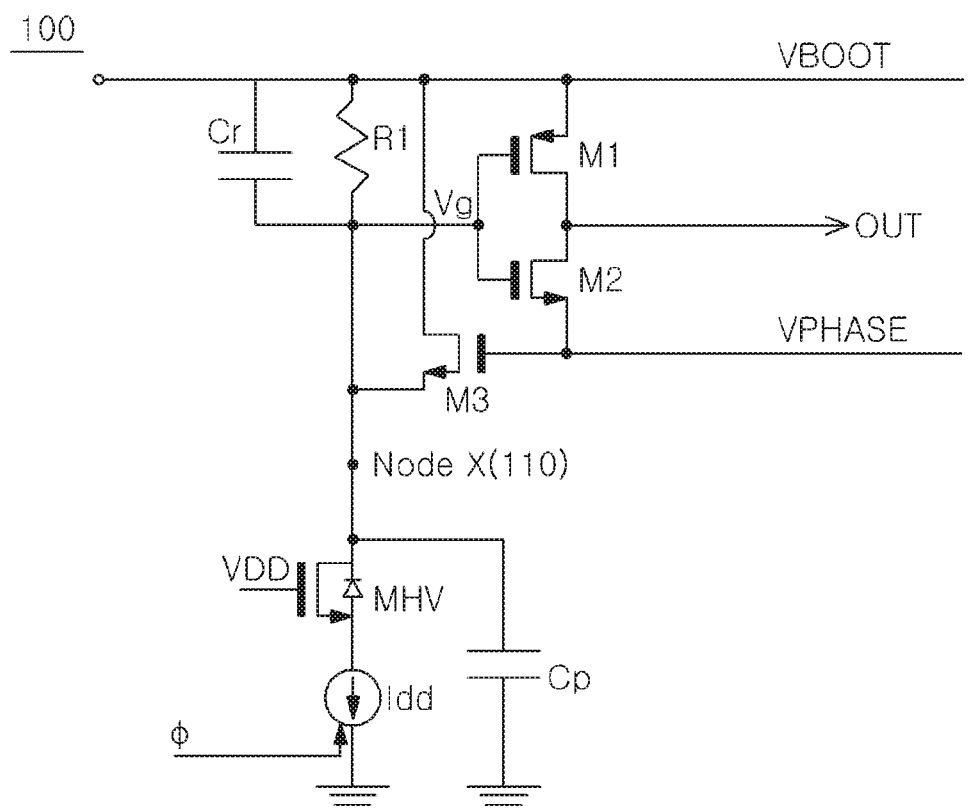
FIGS. 1 and 2 are diagrams illustrating examples of conventional high-voltage level shifting circuits.

Embodiments of the present invention will be described in detail with reference to the accompanying drawings. In the following description of the present invention, if it is determined that detailed descriptions of related well-known configurations or functions may make the gist of the present invention obvious, the detailed descriptions will be omitted. Furthermore, the specifications illustrated in the drawings and the embodiments may be exaggerated for ease of description.

However, the present invention is not restricted or limited to the embodiments. The same reference symbols represented throughout the drawings designate the same elements.

Figure 3:
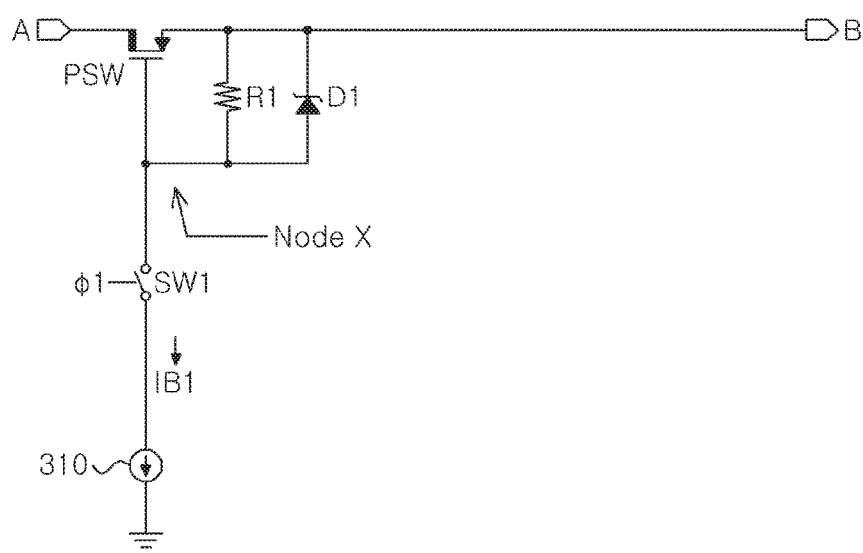
FIG. 3 is a diagram illustrating a part of a pass switch circuit according to an embodiment of the present invention.

FIG. 3 is a diagram illustrating a part 300 of a pass switch circuit according to an embodiment of the present invention.

Referring to FIG. 3, a pass switch PSW for transferring a voltage level from an input node A to an output node B is illustrated. Although a P-type pass switch has been illustrated as the pass switch in FIG. 3, the spirit of the present invention is not limited thereto. The pass switch PSW is a device for transferring a voltage level from the input node A to the output node B, and may be any one of P-type and N-type pass switches. Furthermore, it is sufficient if the voltage of the output node B is determined based on the voltage level of the input node A at the pass switch PSW, and the voltage of the output node B does not necessarily need to be equal to the voltage level of the input node A.

More specifically, the pass switch PSW may be a device for transferring a high voltage in a high-voltage application, in which case where the pass switch PSW may be implemented using a DMOS or LDMOS-type transistor, as illustrated in FIG. 3.

Furthermore, in FIG. 3, the drain node of the pass switch PSW is illustrated as the input node A, and the source node thereof is illustrated as the output node B, which is a design for preparing for the case where the voltage level of the output node B is higher than the voltage level of the input node A. It will be apparent to those skilled in the art that in the opposite case, the locations of the drain and the source may be interchanged with each other.

Referring to FIG. 3, the pass switch PSW is a P-type LDMOS transistor, and the LDMOS transistor is a device that is generally configured to increase a drain-source breakdown voltage. Accordingly, when the drain-source voltage of the pass switch PSW is equal to or lower than a breakdown voltage, there is no problem with operation. However, the gate-source voltage of the pass switch PSW has a limit voltage considerably lower than the breakdown voltage, and thus a circuit including the pass switch PSW, such as that illustrated in FIG. 3, requires a circuit for limiting a gate-source voltage. Since the node X is the control node of the pass switch PSW, the circuit for limiting a gate-source voltage of the pass switch PSW limits the voltage Vx, the voltage of the node X, within a specific range from the voltage of output node B.

For this purpose, a current source 310 and a resistor R1 may be configured as a bias circuit. When an input control signal φ1 is on, the first switch SW1 is short-circuited, and then a bias current IB1 flows from the output node B through the resistor R1 and a node X. In this case, when a steady state has been reached after a transient response, the gate-source voltage of the pass switch PSW will be constantly maintained at IB1·R1.

Meanwhile, when an accidental event, such as a case where the voltage of the output node B suddenly increases, apart from the switching of the first switch SW1 by the input control signal φ1, occurs, a Zener diode D1 connected in parallel with the resistor R1 between the gate and source of the pass switch PSW may function as a clamping circuit in order to regulate the gate-source voltage of the pass switch PSW below the limit voltage. The clamping circuit regulates the gate-source voltage of the pass switch PSW below the limit voltage even in an instantaneous transient state, thereby finally preventing the breakdown of the pass switch PSW and thus protecting the pass switch PSW.

Meanwhile, although not illustrated in FIG. 3, the first switch SW1 may be an N-type LDMOS transistor. For example, when the input control signal φ1 is on (high), the voltage of the control node X of the first switch SW1 becomes high, and thus the first switch SW1 can become on/short-circuited/activated. In contrast, when the input control signal φ1 is off (low), the voltage of the control node X of the first switch SW1 becomes low, and thus the first switch SW1 can become off/open/inactivated. Since the upper limit of the voltage of the drain node of the first switch SW1 follows the voltage of the output node B, the drain-source voltage thereof may be high, and thus a device having a high breakdown voltage, such as an LDMOS transistor, may be adopted. In this case, since the input control signal φ1 may influence the gate-source voltage of the first switch SW1, the input control signal φ1 operates within a voltage range from 0 to VDD, and VDD may be selected as a value lower than the gate-source limit voltage of the LDMOS transistor.

When the input control signal φ1 is turned off, the first switch SW1 is opened and then a steady state is reached after a transient response, current does not flow through the resistor R1, and a voltage across both terminals of the resistor R1 becomes 0 V. Accordingly, the voltage Vx of the node X follows the voltage level of the output node B.

When the pass switch PSW is arranged as illustrated FIG. 3 in accordance with an application, it may function as a type of one-way switch similar to a diode. For example, a state in which the input control signal φ1 has been turned off, the first switch SW1 has been opened and thus the voltage of the node X is high is assumed.

In this case, the voltage of the node X follows the voltage of the output node B as described above. The gate and source of the pass switch PSW have the same voltage level, and thus the pass switch PSW becomes equivalent to a diode having a forward direction from the input node A to the output node B due to a P-N junction between the input node A and the control node X. In this case, when the voltage of the input node A is higher than the voltage of the output node B, the output node B has a voltage level into which a voltage drop by a threshold voltage from the voltage of the input node A has been incorporated. In contrast, when the voltage of the input node A is lower than the voltage of the output node B, a reverse bias is applied between the input node A and the output node B, and thus current seems not to flow through the pass switch PSW in macroscopic view.

Accordingly, in the circuit of FIG. 3, the pass switch PSW functions as a two-way switch or a one-way switch depending on the state of the input control signal φ1.

Figure 2:
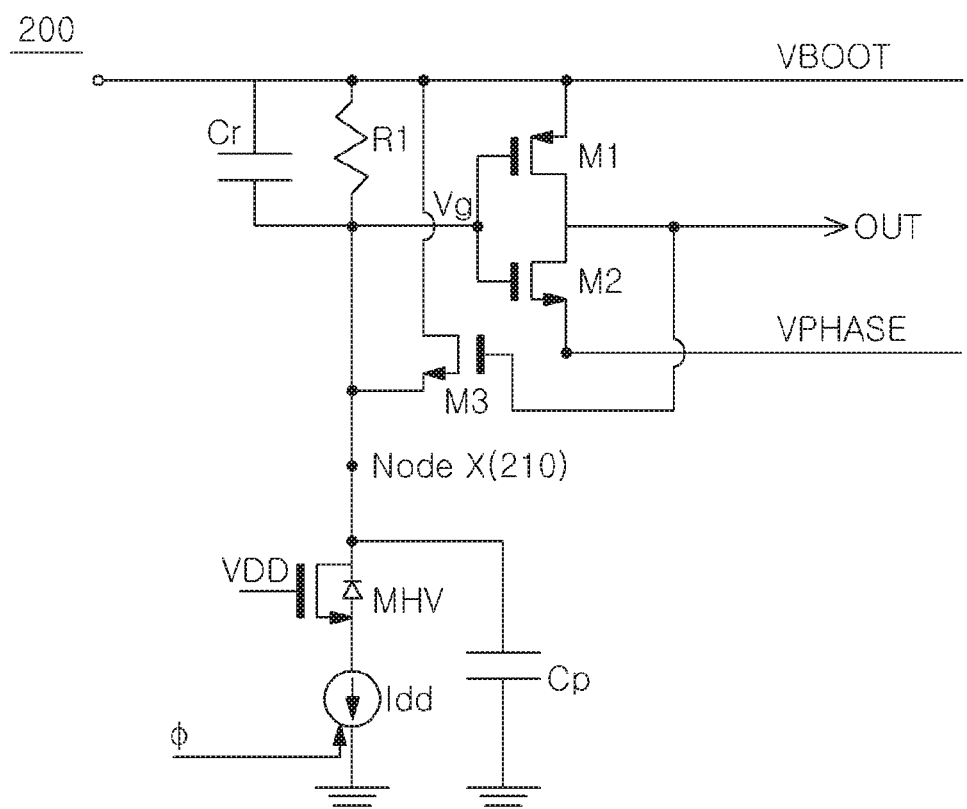

Although the circuit of FIG. 3 seems to successfully perform the function of a pass switch when only steady states are taken into account, a problem arises in that a time response delay attributable to an RC time constant occurs when only the circuit of FIG. 3 is used, as described in connection with the conventional technology of FIGS. 1 and 2.

In order to effectively illustrate a parasitic capacitance in the circuit of FIG. 3, a description will be given with reference to FIG. 10 below.

Figure 10:
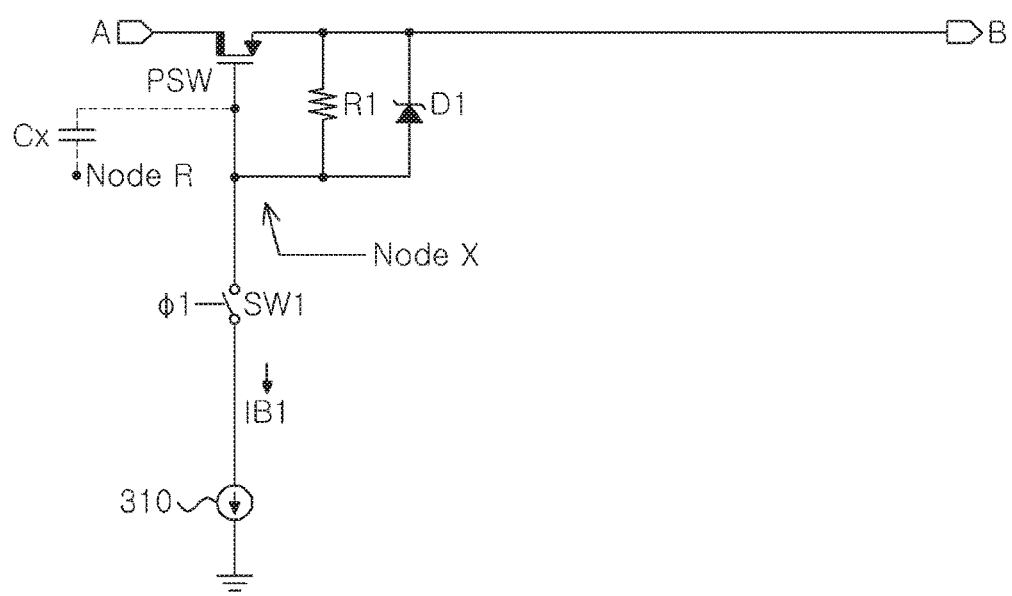
FIG. 10 is a diagram illustrating a parasitic capacitance in order to describe the circuit of FIG. 3.

FIG. 10 is a diagram illustrating a parasitic capacitance Cx in order to describe the circuit of FIG. 3. Referring to FIG. 10, it may be construed that the parasitic capacitance Cx is present between a node X and a virtual reference node R. The virtual reference node R is introduced in order to explain the circuit operation simply. The node R simply may be a ground node GND. But the spirit of the present invention should not defined only by the disclosed embodiments. The parasitic capacitance Cx may be formed by various causes including the influences of the parasitic junction capacitance of a first switch SW1 driven by an input control signal φ1, the parasitic gate capacitance of a pass switch PSW, the parasitic capacitance of a resistor R1 and the parasitic capacitance of a Zener diode D1.

Referring to FIG. 10, the transient response of the circuit of FIG. 3 is described in detail below with reference to FIG. 4.

Figure 4:
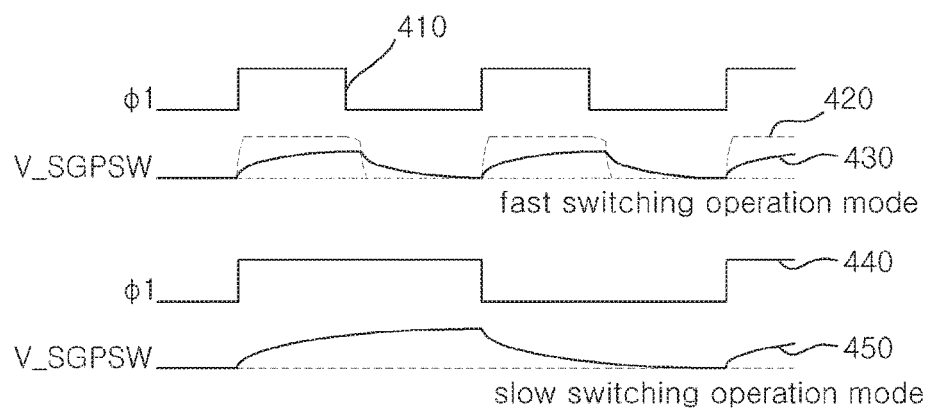
FIG. 4 is a diagram illustrating time response characteristics when only the circuit of FIG. 3 operates.

FIG. 4 is a diagram illustrating time response characteristics when only the circuit of FIG. 3 that constitutes part of an embodiment of the present invention operates.

A waveform 410 is the shape of an input control signal ϕ1 in the case of fast operation, a waveform 420 is the shape of the ideal source-gate voltage V_SGPSW of the pass switch PSW in the case of fast operation, and a waveform 430 is the shape of the actual source-gate voltage V_SGPSW of the pass switch PSW in the case of fast operation. Furthermore, a waveform 440 is the shape of the input control signal ϕ1 in the case of slow operation, and a waveform 450 is the shape of the source-gate voltage V_SGPSW of the pass switch PSW in the case of slow operation. The waveform 420 of the ideal source-gate voltage V_SGPSW of the pass switch PSW in the case of fast operation incorporates the voltage IB1·R1 across both terminals of the resistor R1 in a steady state, and is switched in a voltage range from 0 to IB1·R1. The waveform 440 of the source-gate voltage V_SGPSW of the pass switch PSW in the case of slow operation may be switched in the voltage range from 0 to IB1·R1 if a sufficient time is given.

In a first steady state in which the input control signal ϕ1 is off, the voltage Vx of the node X is the same as the voltage level of the output node B. Accordingly, the pass switch PSW is in the state of being inactivated/off, and the source-gate voltage V_SGPSW of the pass switch PSW is 0 V.

In this case, when the input control signal ϕ1 starts to make transition from an off state to an on state, the first switch SW1 becomes activated/short-circuited and then current starts to flow from the node X through the first switch SW1. In this case, V_SGPSW experiences an RC delay attributable to the time constant R1·Cx due to the combination of the parasitic capacitance Cx and the resistor R1.

Referring to the waveform 430, in the case of fast operation in which the switching period of the input control signal ϕ1 is shorter than the time constant R1·Cx, the first switch SW1 is inactivated/opened before the termination of a transient state, the source-gate voltage V_SGPSW of the pass switch PSW cannot be sufficiently developed. Accordingly, the pass switch PSW cannot be sufficiently turned on, in which case the pass switch PSW cannot reliably function as a pass switch.

Accordingly, when a pass switch circuit is configured using only the circuit of FIG. 3, a problem arises in that the time it takes to flow current from the bias current source 310 should be long when the pass switch PSW is activated, and thus the efficiency of input energy to output energy is poor.

Furthermore, when the pass switch PSW becomes inactivated (the input control signal ϕ1 transitions from an on state to an off state), current enters the parasitic capacitance Cx through the resistor R1 and thus the voltage of the voltage node X increases due to RC delay, with the result that the speed is very slow.

A voltage up converter, or a charge pump, may be implemented using a pass switch circuit 300 depending on the application. When the switching and transient response time of the pass switch PSW is long, charge that should be transferred from the input node A to the output node B may leak from the output node B through the node X, in which case the efficiency of the voltage up converter or charge pump will be significantly reduced.

In order to overcome the above problem, a pass switch circuit according to an embodiment of the present invention proposes a new circuit that can reduce an RC time delay and improve time response characteristics. This newly proposed circuit is described with reference to FIGS. 5 to 11.

Figure 5:
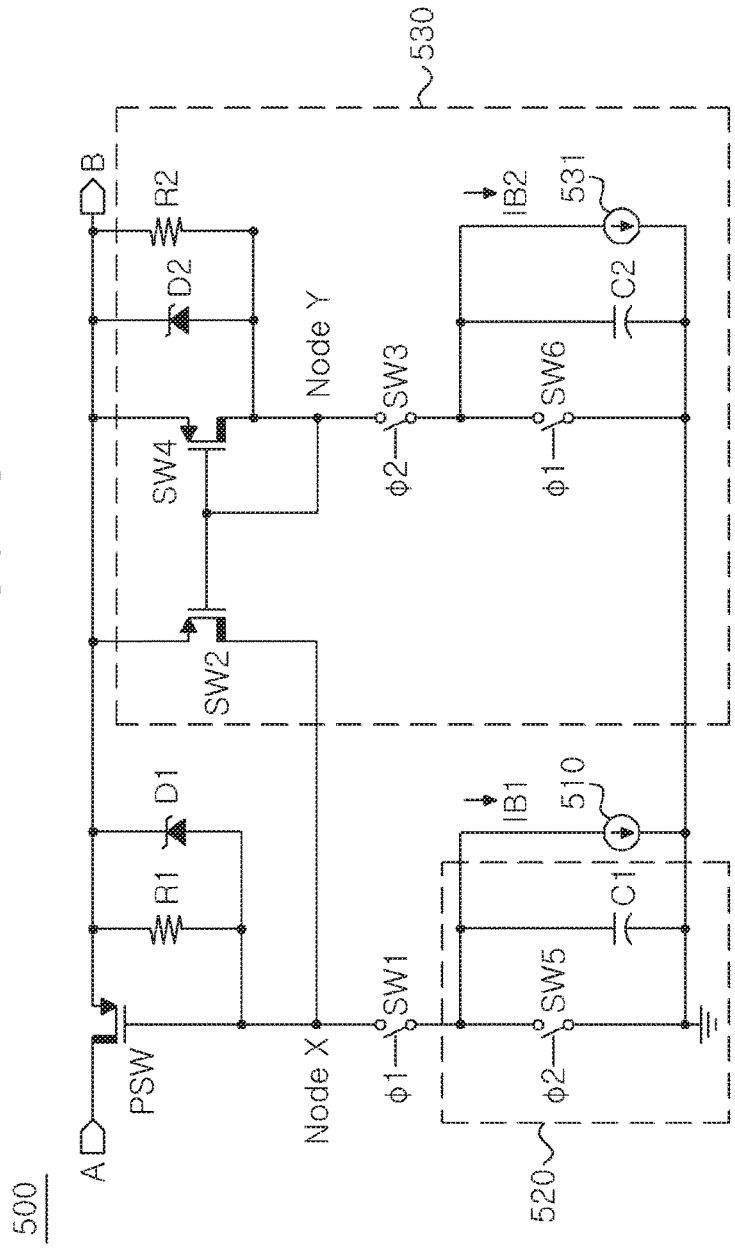
FIG. 5 is a diagram illustrating a pass switch circuit 500 according to an embodiment of the present invention.

FIG. 5 is a diagram illustrating a pass switch circuit 500 according to an embodiment of the present invention.

Referring to FIG. 5, a pass switch PSW, a resistor R1, a bias current source 510, a first switch SW1 controlled in response to an input control signal ϕ1, and a clamping diode D1 are illustrated, as in FIG. 3. Since these components are the same as those of FIG. 3, redundant descriptions thereof are omitted. For example, the first switch SW1, not specifically illustrated in FIG. 5, may implemented using an N-type LDMOS transistor, and the input control signal ϕ1 may swing within a voltage range from 0 to VDD.

In FIG. 5, a first booster circuit 520 that speeds up a transient response in the case of the off-to-on operation of the pass switch PSW is illustrated. Meanwhile, a second booster circuit 530 that speeds up a transient response in the case of the on-to-off operation of the pass switch PSW is also illustrated.

The first booster circuit 520 and the second booster circuit 530 do not influence the steady state of the pass switch circuit 500, but may influence only operations in a transient state. Accordingly, the operations of the pass switch PSW, resistor R1 and clamping diode D1 of FIG. 5 in a steady state are the same as described with reference to FIG. 3.

The first booster circuit 520 includes a first capacitor C1. In this case, the node of one side of the first capacitor C1 may be connected to first power supply. Although a case where the first power supply is a ground GND has been illustrated in FIG. 5, the first power supply does not necessarily need to be a ground, but may be a constant reference voltage. The circuit described below is assumed that the first power supply is the ground GND merely for simplified explanation. A fifth switch SW5 also illustrated to be connected parallel with the both nodes of the first capacitor C1 in FIG. 5, the operations of the fifth switch SW5 will be described below.

The second booster circuit 530 includes a second capacitor C2. In this case, the node of one side of the second capacitor C2 may be connected to second power supply. Although a case where the second power supply is a ground GND has been illustrated in FIG. 5, the second power supply does not necessarily need to be a ground, but may be a constant reference voltage. The first power supply and the second power supply do not need to be the same, but may have different reference voltages.

The second booster circuit 530 may further include a second switch SW2 connected between the output node B and the node X and a third switch SW3 connected between a node Y, that is, the control node of the second switch SW2, and the second capacitor C2. In this case, the third switch SW3 is controlled in response to another input control signal ϕ2 whose phase has been inverted from that of the input control signal ϕ1 of the first switch SW1. That is, in a steady state, the third switch SW3 operates in a phase opposite that of the operation of the first switch SW1.

The second booster circuit 530 may further include a second switch SW2 and a fourth switch SW4, that is, a current mirror, and may include a clamping diode D2 connected between the node Y and the output node B.

In this case, although the second booster circuit 530 has been illustrated as being connected between the node X and the output node B in FIG. 5, the topology of the second booster circuit 530 may follow the locations of the resistor R1 and the clamping diode D1, which are a bias circuit and a clamping circuit, respectively. That is, in an application, when the output node B corresponds to the source of the P-type pass switch PSW as illustrated in FIG. 5, the bias circuit, the clamping circuit and the second booster circuit 530 are all connected to the output node B. In another embodiment, the input node A corresponds to the source of the P-type pass switch PSW, in which case the bias circuit, the clamping circuit and the second booster circuit 530 may be all connected to the input node A. The second booster circuit 530 may further include a sixth switch SW6, which is connected parallel with the both nodes of the second capacitor C2, and a second current source 531, which is also connected parallel with the both nodes of the second capacitor C2 and supplies with a bias current IB2. The operations of sixth switch SW6 and the second current source 531 will be described in detail below.

The third switch SW3 becomes short-circuited and guides the voltage of the node Y to a lower voltage in a first steady state in which the input control signal φ1 is off and the inverted input control signal φ2 is on. The second switch SW2 functions to connect the node X with the output node B in the first steady state in which the input control signal φ1 is off. In this case, the voltage Vy of the node Y, that is, the control node of the second switch SW2, has a voltage lower than that of the output node B, and the difference between the voltage of the output node B and Vy may be determined by the breakdown voltage of the clamping diode D2. Alternatively, as illustrated in FIG. 5, an additional resistor, such as R2, may be connected between the node Y and the output node B, thereby maintaining a voltage between the output node B and the node Y at a bias voltage IB2·R2 in the first steady state in which the input control signal φ1 is off.

Although not illustrated more specifically in FIG. 5, the third switch SW3 may be an N-type LDMOS transistor like the first switch SW1, and the inverted input control signal φ2 may also swing in a voltage range from 0 to VDD.

The third switch SW3 is opened in a second steady state in which the input control signal φ1 is on and the inverted input control signal φ2 is off, and the voltage of the node Y may be determined by the threshold voltage VT,SW4 of the fourth switch SW4. In the second steady state, the fourth switch SW4 functions as a type of diode because the control node and the drain node are all connected to the node Y. In this case, in the second steady state, current does not flow through the fourth switch SW4, and thus the node Y has a voltage lower than the voltage of the output node B by VT,SW4. As described above, as illustrated in FIG. 5, if a resistor, such as R2, is connected between the node Y and the output node B, the voltage of the node Y will follow the voltage of the output node B in the second steady state.

When the second switch SW2 and the fourth switch SW4 have the same characteristics and constitute a current mirror, the second switch SW2 may be inactivated/off like the fourth switch SW4 in the second steady state.

Figure 11:
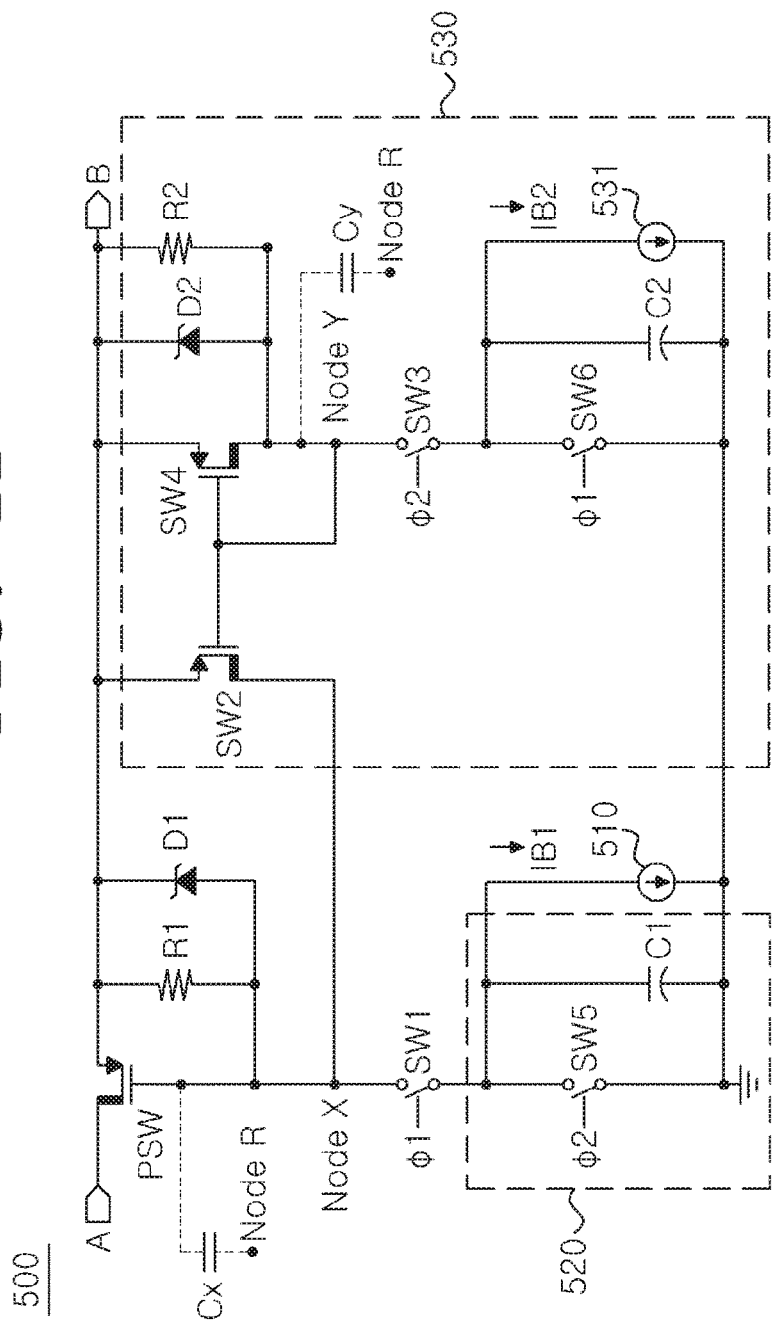
FIG. 11 is a diagram illustrating parasitic capacitances in order to illustrate the circuit of FIG. 5.

Since an understanding of a parasitic capacitance is required to illustrate a transient response in the circuit of FIG. 5, the following description is given with reference to FIG. 11 in order to effectively illustrate the parasitic capacitance.

FIG. 11 is a diagram illustrating parasitic capacitances Cx and Cy in order to illustrate the circuit of FIG. 5. Referring to FIG. 11, it may be construed that the parasitic capacitance Cx is present between the node X and the virtual reference node R and the parasitic capacitance Cy is present between the node Y and the virtual reference node R. The parasitic capacitance Cx may be formed by various reasons including the influences of the parasitic junction capacitance of the first switch SW1 controlled in response to the input control signal φ1, the parasitic gate capacitance of the pass switch PSW, the parasitic capacitance of the resistor R1, and the Zener diode D1 of the parasitic capacitance. The parasitic capacitance Cy may be also formed by various reasons including the influences of the parasitic junction capacitance of the third switch SW3 controlled in response to the inverted input control signal φ2, the parasitic gate capacitance of the second switch SW2 and the fourth switch SW4 and the parasitic capacitance of the clamping diode D2.

Referring to FIG. 11, the transient response of the circuit of FIG. 5 is described in detail with reference to the waveform of FIG. 6.

Figure 6:
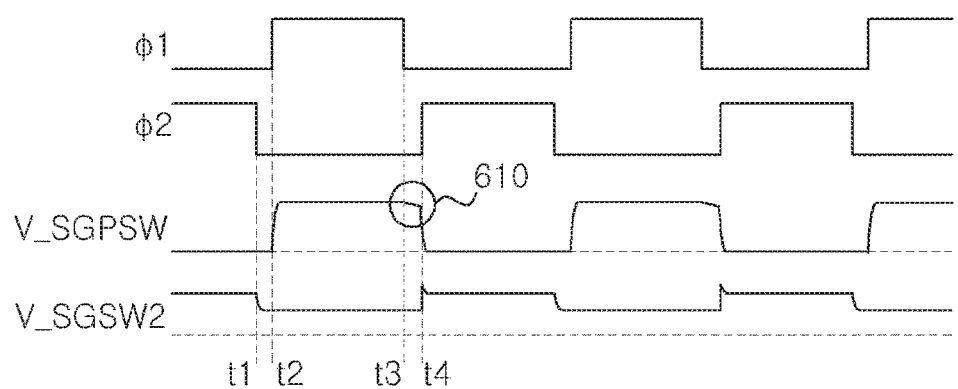
FIG. 6 is a diagram illustrating time response characteristics when the circuit of FIG. 5 operates.

FIG. 6 is a diagram illustrating time response characteristics when the circuit 500 of FIG. 5 according to an embodiment of the present invention operates.

In the first steady state (in which the input control signal φ1 is off and φ2 is on, t<t1), the voltage Vx of the node X follows the voltage of the output node B.

In the first steady state, the pass switch circuit is controlled by the fifth switch SW5 within the first booster circuit 520 so that the nodes of both sides of the first capacitor C1 have the voltage level of the first power supply. Although the first power supply does not necessarily need to be a ground GND, the following description is given based on the case where the first power supply is a ground for ease of description.

When the input control signal φ1 is turned on in an off state (at t=t2), the first switch SW1 becomes short-circuited, and the first capacitor C1 and the node X are connected. In this case, although the parasitic capacitance Cx of the node X is in the state of being charged with the voltage of the output node B, charge sharing occurs between the first capacitor C1 and the parasitic capacitance Cx. If it is assumed that the voltage Vx of the node X has a voltage level Vx,o in the first steady state (t<t1), the voltage Vx,o+ of the node X after charge sharing (t=t2+0) may be obtained by the following Equation 7 through simple modeling:

$$Vx,o+=Vx,o \cdot Cx/(C1+Cx) \quad (7)$$

where C1 is the capacitance value of the first capacitor C1.

Equation 7 is not intended for accurate modeling, but is an equation that is introduced merely to describe the key concept of the present invention. Equation 7 is obtained by performing simple modeling, with a focus on dominant parameters.

After charge sharing has been occurred (t>t2), the time response of Vx is determined by a time constant R1·(Cx+C1). However, the present technology is different from the conventional technology in that the start point of Vx is not Vx,o but Vx,o+ that has been considerably reduced by charge sharing. Because of this, upon transient response, Vx can be rapidly changed to a value in the second steady state even when an RC delay attributable to a time constant is taken into account. This is illustrated in FIG. 6. From FIG. 6, it can be seen that the source-gate voltage V_SGPSW of the pass switch PSW has a value close to a bias value IB1·R1 in the second steady state almost at the same time that the input control signal φ1 is turned on.

In this case, although not illustrated in FIG. 6, when the voltage of the node X is excessively reduced because the value of the first capacitor C1 is considerably large, an overshoot in which the source-gate voltage V_SGPSW of the pass switch PSW instantaneously has a value larger than the bias value IB1·R1 in the second steady state may occur. In this case, the clamping diode D1 may regulate the source-gate voltage V_SGPSW of the pass switch PSW not to exceed a limit voltage. Accordingly, it can be seen that when a circuit is configured as illustrated in FIG. 5, the degree of freedom of design can be achieved in the determination of the value of the first capacitor C1.

In an application, for example, Vx,o+ may be 40 V, and Vx may be 30 V in the second steady state. In this case, it is sufficient if the value of the first capacitor C1 is determined to be ⅓ of the parasitic capacitance Cx. Even when the value of the modeled parasitic capacitance Cx includes an error due to a change in temperature, process or environment, a safety device, such as the clamping circuit D1, is present as described above, and thus the degree of freedom of design can be achieved in the determination of the value of the first capacitor C1.

In this case, although the fifth switch SW5 has been illustrated as short-circuiting the nodes of both sides of the first capacitor C1 in the first steady state in FIG. 5, the spirit of the present invention is not limited thereto, but design may be made such that a voltage across the nodes of the both sides of the first capacitor C1 may has a constant value, other than 0. In this case, it is sufficient if the first power supply to which the node of the one side of the first capacitor C1 is connected and a voltage across the nodes of the both sides of the first capacitor C1 in the first steady state are at the levels at which Vx,o in the first steady state can be dropped by charge sharing. The voltage of the node of the other side of the first capacitor C1, other than the node of the one side of the first capacitor C1 connected to the first power supply, in the first steady state may be designed such that the target voltage of Vx in the second steady state is located between the voltage of the node of the other side of the first capacitor C1 in the first steady state and Vx,o in the first steady state. If the voltage of the output node B is the same in both the first steady state and the second steady state, the target voltage Vx,1 of Vx in the second steady state may be expressed by Equation 8 below:

$$Vx,1 = Vx,o - IB1 \cdot R1 \quad (8)$$

That is, the target voltage Vx,1 of Vx in the second steady state is determined by the voltage of the output node B in the second steady state and a bias voltage attributable to the bias circuit.

In the case where the pass switch circuit 500 rapidly reaches the second steady state and then the input control signal φ1 transitions from an on state to an off state, a transient response is achieved as follows.

First, in the second steady state (t2<<t<t3), the input control signal φ1 is on, so that a sixth switch SW6 is short-circuited and thus the nodes of both sides of the second capacitor C2 are short-circuited. In this case, the node of one side of the second capacitor C2 may be connected to the second power supply, and the second power supply may be a ground GND but may be another level of reference voltage as described above. For ease of description, on the assumption that the second power supply is a ground, as illustrated in FIG. 5, the following description will be given. That is, control is made such that the nodes of both sides of the second capacitor C2 all have a voltage of 0 V in the second steady state.

Furthermore, in the second steady state, the voltage of the node Y is formed by incorporating a voltage drop by a threshold voltage VT,SW4 from the voltage of the output node B of the fourth switch SW4. That is, the source-gate voltage V_SGSW2 of the second switch SW2 has a value of VT,SW4 in the second steady state.

When the input control signal φ1 starts to make transition from an on state to an off state, the first switch SW1 becomes opened, and the voltage of the node X starts to be increased by the resistor R1 in order to follow the voltage of the output node B. Due to the presence of the resistor R1, the target voltage of the node X in the first steady state is the voltage of the output node B as described above. In this case, the time response characteristic of the voltage Vx of the node X is determined by the time constant R1·Cx, in which case a change in Vx will occur very slowly. Since V_SGPSW of FIG. 6 represents (the voltage of the output node B-Vx), the shape in which the input control signal φ1 transitions from an on state to an off state and then V_SGPSW drops slightly exhibits a transient response based on the time constant R1·Cx as illustrated in a part 610 of curve in FIG. 6. That is, in the time interval, t3<t<t4, after the input control signal φ1 has made transition from an ON state to an OFF state and before the inverted input control signal φ2 starts to make transition from an OFF state to an ON state, Vx follows the transient response due to time constant time constant R1·Cx.

Thereafter, when the inverted input control signal φ2 starts to make transition from an off state to an on state, at t=t4, the third switch SW3 becomes short-circuited, and the node Y and the second capacitor C2 are connected to each other. In this case, Vy may drop rapidly due to charge sharing between the parasitic capacitance Cy and the second capacitor C2. Referring to FIG. 6, the source-gate voltage V_SGSW2 of the second switch SW2 rapidly increases as the inverted input control signal φ2 makes transition from an off state to an on state, in which case the rapid increase results from charge sharing between the parasitic capacitance Cy and the second capacitor C2. Refer to FIG. 6, in the time interval t>t4, the source-gate voltage of the second switch SW2 V_SGSW2 rises rapidly due to charge sharing, accordingly the source-gate voltage V_SGPSW can fall rapidly to 0.

When the voltage of the node Y changes rapidly, the source-gate voltage V_SGSW2 of the second switch SW2 may instantaneously exceed a limit voltage. In preparation for this case, the clamping diode D2 is arranged, in which case the value of the source-gate voltage V_SGSW2 of the second switch SW2 in the first steady state is determined based on the reverse voltage of the clamping diode D2. That is, the source-gate voltage V_SGSW2 of the second switch SW2 is determined based on the reverse voltage of the clamping diode D2 in the first steady state, and may be determined by the threshold voltage VT,SW4 of the fourth switch SW4 in the second steady state.

When the voltage of the node Y changes rapidly and the second switch SW2 is turned on, the voltage of the node X rapidly increases to a voltage close to the voltage of the output node B. The node X has the same voltage as the output node B. Accordingly, the source-gate voltage V_SGPSW of the pass switch PSW becomes 0, and the pass switch circuit 500 reaches the first steady state.

Although the sixth switch SW6 has been illustrated as short-circuiting the nodes of both sides of the second capacitor C2 in the second steady state in FIG. 5, the nodes of the both sides of the second capacitor C2 do not necessarily need to be short-circuited in the second steady state for the same reason as the first capacitor C1. Design may be made such that a voltage across the nodes of both sides of the second capacitor C2 has a constant value, other than 0. In this case, it is sufficient if the second power supply to which the node of the one side of the second capacitor C2 is connected and a voltage across the nodes of the both sides of the second capacitor C2 in the second steady state are at the levels at which Vy in the first steady state can be dropped by charge sharing. The voltage of the node of the other side of the second capacitor C2, other than the node of the one side of the second capacitor C2 connected to the second power supply, in the first steady state may be designed such that the target voltage of Vy in the first steady state is located between the voltage of the node of the other side of the second capacitor C2 in the second steady state and Vy in the second steady state.

The result of the charge sharing between the parasitic capacitance Cy and the second capacitor C2, Vy is determined by the ratio between the parasitic capacitance Cy and the capacitance C2 of the second capacitor C2. In this case, even when Vy decreases excessively rapidly because C2 is large, V_SGSW2 is clamped by the clamping diode D2 and thus the second switch SW2 and the fourth switch SW4 can be protected, with the result that the degree of freedom of the design of C2 is achieved.

That is, even when the value of the modeled parasitic capacitance Cy has an error due to a change in temperature, process or environment, a safety device, such as the clamping diode D2, is present as described above, and thus the degree of freedom of design is achieved in the determination of the value of the second capacitor C2.

Referring again to FIG. 6, a state in which the input control signal φ1 and the inverted input control signal φ2 are all off is present in time interval t1<t<t2, and t3<t<t4. If the input control signal φ1 and the inverted input control signal φ2 are simultaneously turned on, a current path extending from the node X or node Y to the ground GND is established, and a very large through current may flow from the output node B to the ground GND depending on a bias condition. Since this large through current may seriously degrade the efficiency of the pass switch circuit 500, design should be made such that the input control signal φ1 and the inverted input control signal φ2 are prevented from being simultaneously turned on.

Meanwhile, in a transient state in which transition from the second steady state to the first steady state is made, that is, a state in which the input control signal φ1 is turned off and the inverted input control signal φ2 is not turned on yet, the source-gate voltage V_SGPSW of the pass switch PSW exhibits a transient response characteristic attributable to the time constant R1·Cx. Since the amount of leakage charge from the output node B increases as the transient response time attributable to the time constant R1·Cx exhibited by the source-gate voltage V_SGPSW of the pass switch PSW increases, design needs to be made such that a time interval between the point of time at which the input control signal φ1 is turned off and the point of time at which the inverted input control signal φ2 is turned on thereafter is not excessively long. That is, it is sufficient if the time interval between the point of time at which the input control signal φ1 is turned off and the point of time at which the inverted input control signal φ2 is turned on thereafter is a time sufficient for the input control signal φ1 to be turned off and also for the first switch SW1 and the sixth switch SW6 to be opened. A time interval longer than the above-described time interval may be a cause of reducing the efficiency of the pass switch circuit 500.

Figure 7:
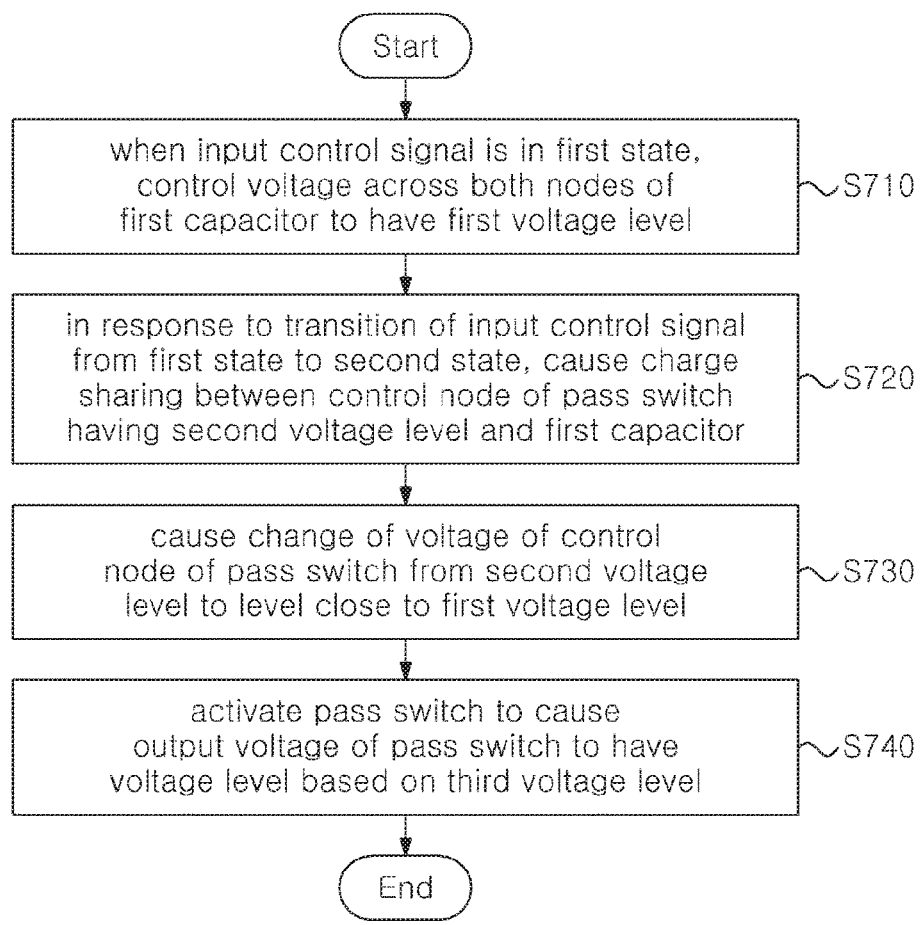
FIG. 7 is an operation flowchart illustrating a method of controlling a pass switch according to an embodiment of the present invention.

FIG. 7 is an operation flowchart illustrating a method of controlling a pass switch according to an embodiment of the present invention.

Referring to FIG. 7, the pass switch circuit 500 controls a voltage across the nodes of both sides of the first capacitor C1 to reach a first voltage level when the voltage Vx of the control node X of the pass switch PSW is in a first state at step S710. In other words, step S710 is equivalent to the step of controlling the node of one side of the first capacitor C1 to have a voltage at the first voltage level. In this case, although the first voltage level has been illustrated as corresponding to a ground GND in FIG. 5, the spirit of the present invention is not limited thereto, as described above.

Furthermore, the state that the voltage Vx of the control node X of the pass switch PSW is in the first state means that Vx is in the state of following the voltage of the output node B as the first steady state. When the input control signal φ1 in the first state (an off state) enters the first steady state, the voltage Vx of the control node X of the pass switch PSW reaches a first state (V_SGPSW=0), so that the expression that the input control signal φ1 is in the first state (an off state) may be viewed as being equivalent to the expression that the voltage Vx of the control node X the pass switch PSW is in the first state (V_SGPSW=0).

In response to an event in which the input control signal φ1 makes transition from a first state (an off state) to a second state (an on state), the pass switch circuit 500 causes charge sharing occurred, between the control node X of the pass switch PSW having the second voltage level Vx,o and the first capacitor C1 at step S720.

Step S720 may be regarded as the step of connecting the control node X of the pass switch PSW with the terminal of one side of the first capacitor C1 by short-circuiting the first switch SW1 using the input control signal φ1.

The pass switch circuit 500 causes change of the voltage Vx of the control node X of the pass switch PSW from the second voltage level Vx,o to a level close to the first voltage level GND by charge sharing at step S730.

Step S730 is the step of changing the voltage Vx of the control node X of the pass switch PSW from the first state Vx,o to the second state Vx,o+ by generating charge sharing between the control node X of the pass switch PSW having the second voltage level Vx,o and the first capacitor C1. As described above, the charge sharing can promote the change of Vx. That is, the change of Vx that has been dependent only on an RC delay based on the RC time constant in conventional technology is promoted using charge sharing.

The pass switch circuit 500 activates/turns on the pass switch PSW to cause the voltage of the output node B of the pass switch PSW to have a voltage level based on the third voltage level at step S740. In this case, the third voltage level means the voltage of the input node A. If the pass switch PSW is used and transient response time sufficient to reach a steady state is given, the voltage of the output node B will follow the voltage of the input node A. In an embodiment, the pass switch may be an N-type transistor, in which case the voltage of the output node B will be determined by the voltage of the input node A and the voltage of the control node of the pass switch.

Figure 8:
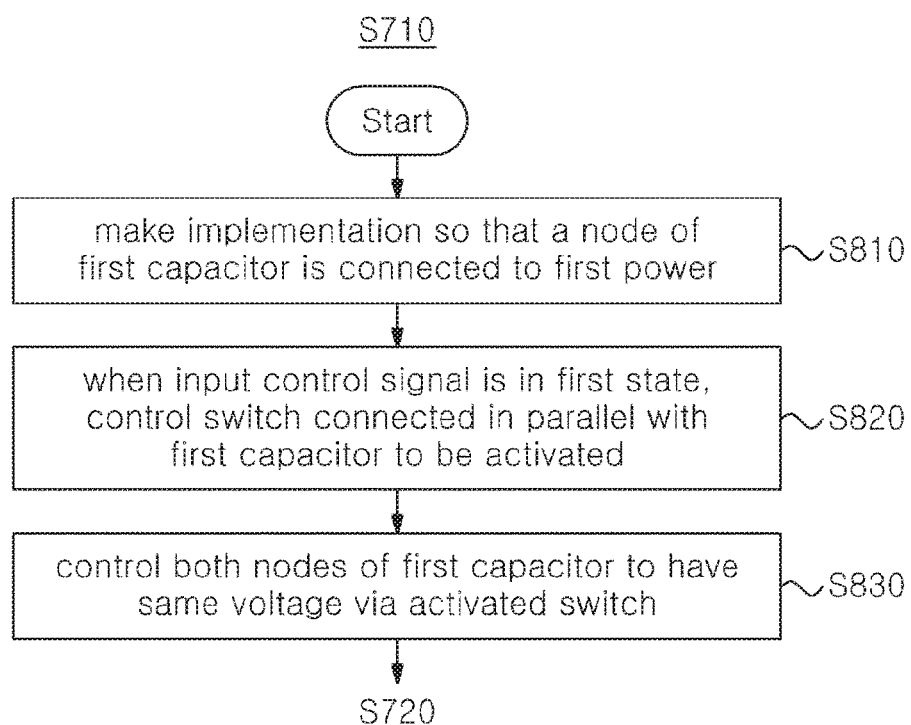
FIG. 8 is an operation flowchart illustrating a specific embodiment step S710 of FIG. 7 in detail.

FIG. 8 is an operation flowchart illustrating a specific embodiment of step S710 of FIG. 7 in detail.

Referring to FIG. 8, an implementation is made such that the node of one side of the first capacitor C1 is connected to a first power supply GND at step S810.

The pass switch circuit 500 controls the fifth switch SW5 connected in parallel with the first capacitor C1 to be activated/short-circuited if the inverted input control signal φ2 is turned on when the input control signal φ1 is in a first state (in an off state) at step S820.

The pass switch circuit 500 controls the nodes of both sides of the first capacitor C1 to have the same voltage via the fifth switch SW5 at step S830.

Figure 9:
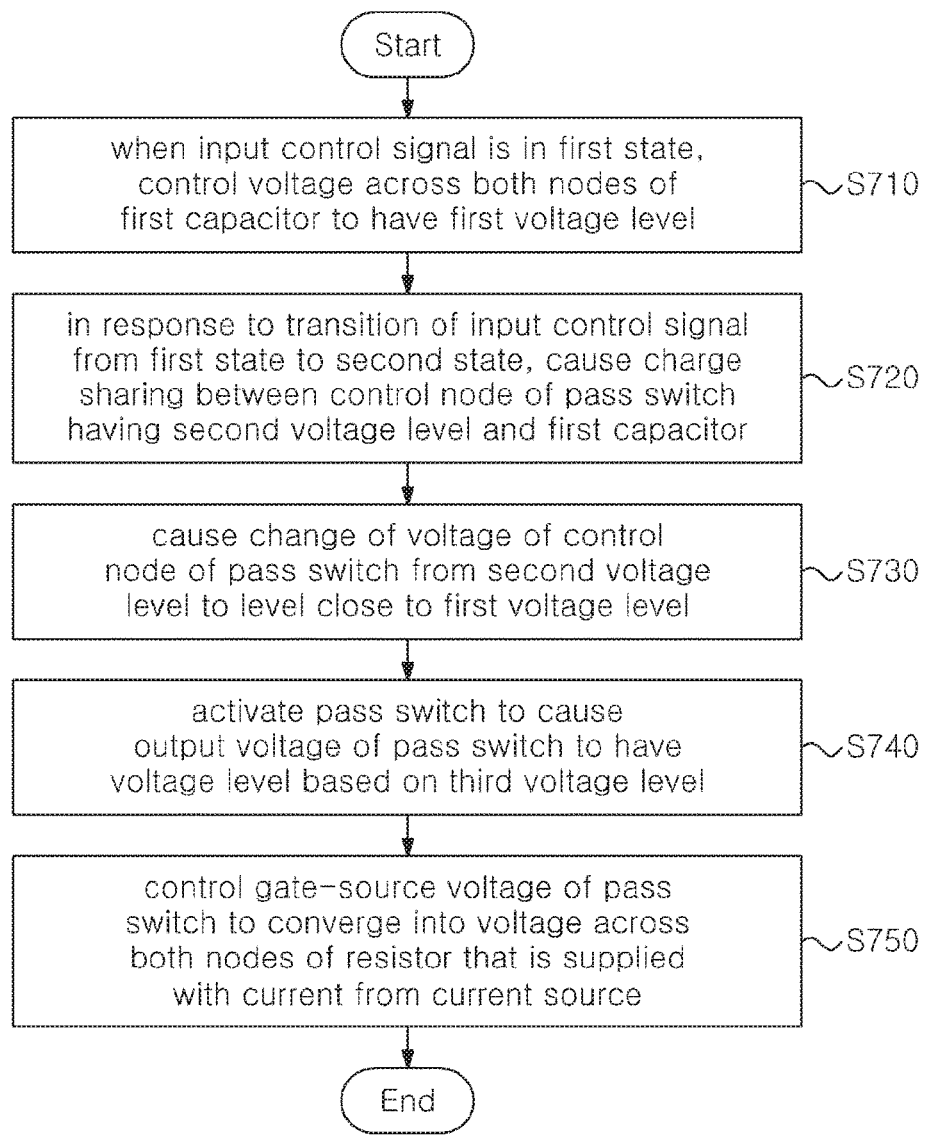
FIG. 9 is an operation flowchart illustrating a method of controlling a pass switch according to another embodiment of the present invention.

FIG. 9 is an operation flowchart illustrating a method of controlling a pass switch according to another embodiment of the present invention.

Since steps S710 to S740 of FIG. 9 are the same as steps S710 to S740 of FIG. 7, redundant descriptions thereof are omitted.

Referring to FIG. 9, the pass switch circuit 500 controls the source-gate voltage of the pass switch PSW to converge into the voltage IB1·R1 across both terminals of the resistor R1 supplied with a current from the current source IB1 at step S750.

The present invention is characterized by a configuration for, in connection with a change of the voltage of the control node X of the pass switch PSW from the first steady state Vx,o to the second steady state Vx,1, promoting a rapid change from the first steady state Vx,o to a preliminary second state Vx,o+ preceding the second steady state Vx,1 by applying a charge sharing technique prior to a transient response attributable to an RC delay.

The charge sharing is used to change the start point of a transient response to a preliminary second state close to the second steady state in order to reduce transient response time attributable to the RC delay. A capacitor adapted to generate charge sharing and a voltage pre-charged into the capacitor may be designed based on a voltage start point that is intended to reduce the transient response time.

According to the present invention, in a pass switch circuit, a RC delay can be reduced and also fast time response speed can be achieved.

According to the present invention, the design of a circuit capable of providing stable and fast high-voltage switching operation is enabled regardless of the characteristics of devices, such as the threshold voltages of transistors, etc., that constitute the circuit. The circuit designer does not need to consider a large number of factors, related to the areas of devices, such as a transistor and a resistor, etc. in circuit design, and thus the degree of freedom of circuit design can be considerably increased. For the same reason, the number of constraint conditions for circuit design is small, and thus the performance of a circuit can be easily optimized.

According to the present invention, it is possible to improve time response performance while satisfying a low Vgs condition for the protection of a pass switch that transfers a high-voltage level, and the transient time it takes for a pass switch to reach a desired operation state can be reduced, thereby reducing leakage current that is generated during the transient time.

According to the present invention, when a pass switch is used in a charge pump or a pass switch is used in place of a diode, the transient time it takes to reach a desired operation state can be reduced, thereby reducing leakage current and also effectively achieving performance that an application is intended to achieve.

Although the present invention has been described with reference to the specific details, such as the specific components, and the limited embodiments and drawings, this is provided merely to help a general understanding of the present invention, and is not intended to limit the present invention to the specific details and the embodiments and drawings. It will be apparent to those having ordinary knowledge in the art to which the present invention pertains that various modifications and variations can be made based on the above detailed description.

Accordingly, the spirit of the present invention should not defined only by the disclosed embodiments, and not only the attached claims but also all equivalent to the claims and including equivalent modifications fall within the scope of the spirit of the present invention.

What is claimed is:

1. A pass switch circuit, comprising:
   a pass switch configured to transfer a voltage level from an input node to an output node;
   a first capacitor configured such that a node of one side thereof has a first off-state level of voltage when the pass switch is in an OFF steady state, wherein the first off-state level of voltage has an inverted polarity from that of a second off-state level of voltage of a control node of the pass switch in the OFF steady state, and wherein a node of the other side of the first capacitor is consistently connected to a first power supply when the pass switch is in the OFF steady state and to the first power supply when the pass switch is in an ON steady state; and
   a first switch configured to:
      connect the node of the one side of the first capacitor having the first off-state level of voltage with the control node of the pass switch having the second off-state level of voltage when the pass switch is in the OFF steady state,
      cause a change of the voltage of the control node of the pass switch from the second off-state level to the first off-state level by the connection of the node of the one side of the first capacitor with the control node of the pass switch, and
      cause a transition of the pass switch from the OFF steady state to an ON state by the connection of the node of the one side of the first capacitor with the control node of the pass switch.

2. The pass switch circuit of claim 1, further comprising:
   a resistor connected between the control node of the pass switch and any one of the input and output nodes; and
   a current source connected to the control node of the pass switch via the first switch.

3. The pass switch circuit of claim 1, further comprising a clamping circuit connected to the control node of the pass switch and any one of the input and output nodes.

4. The pass switch circuit of claim 1, wherein nodes of both sides of the first capacitor all have the first off-state level of voltage when the pass switch is in the OFF steady state.

5. The pass switch circuit of claim 1, wherein, when the first switch connects the node of the one side of the first capacitor with the control node of the pass switch, a process in which the voltage of the control node of the pass switch changes from the second off-state level to the first off-state level is promoted by charge sharing between a parasitic capacitance of the control node of the pass switch and the first capacitor.

6. A pass switch circuit, comprising:
   a pass switch configured to transfer a voltage level from an input node to an output node;
   a first capacitor configured such that a node of one side thereof has a first level of voltage when a voltage of a control node of the pass switch is in a first state;
   a first switch configured to connect the node of the one side of the first capacitor with the control node of the pass switch;
   a second switch connected to the control node of the pass switch and any one of the input and output nodes;
   a third switch connected to a control node of the second switch; and
   a second capacitor configured such that a node of one side thereof is connected to the control node of the second switch via the third switch and the node of the one side of the second capacitor has a second level of voltage when the voltage of the control node of the pass switch is in a second state.

7. The pass switch circuit of claim 6, further comprising a fourth switch configured such that a node of one side thereof is connected to the any one of the input and output nodes to which the second switch is connected, a node of the other side thereof is connected to the control node of the second switch, and a control node thereof is connected to the control node of the second switch.

8. The pass switch circuit of claim 6, wherein the third switch, when the voltage of the control node of the pass switch is in the second state, connects the node of the one side of the second capacitor with the control node of the second switch, changes a voltage of the control node of the second switch, and changes the voltage of the control node of the pass switch from the second state to the first state in response to the change in the voltage of the control node of the second switch.

9. The pass switch circuit of claim 6, wherein, when the third switch connects the node of the one side of the second capacitor with the control node of the second switch, a change in a voltage of the control node of the second switch is promoted by charge sharing between a parasitic capacitance of the control node of the second switch and the second capacitor, and the voltage of the control node of the pass switch changes from the second state to the first state in response to the change in the voltage of the control node of the second switch.

10. A method of controlling a pass switch, comprising:
controlling a node of one side of a first capacitor to have a first off-state level of voltage when a pass switch is in an OFF steady state, wherein the first off-state level of voltage has an inverted polarity from that of a second off-state level of voltage of a control node of the pass switch in the OFF steady state, and wherein a node of the other side of the first capacitor is consistently connected to a first power supply when the pass switch is in the OFF steady state and to the first power supply when the pass switch is in an ON steady state;
connecting the control node of the pass switch having the second off-state level of voltage with the node of the one side of the first capacitor having the first off-state level of voltage in response to an input control signal when the pass switch is in the OFF steady state;
causing a change of a voltage of the control node of the pass switch from the second off-state level to the first off-state level by the connection of the node of the one side of the first capacitor with the control node of the pass switch; and
causing a transition of the pass switch from the OFF steady state to an ON state by the connection of the node of the one side of the first capacitor with the control node of the pass switch.

11. The method of claim 10, wherein causing a change of the voltage of the control node of the pass switch from the second off-state level to the first off-state level comprises promoting a process in which the voltage of the control node of the pass switch changes from the second off-state level to the first off-state level by charge sharing between a parasitic capacitance of the control node of the pass switch and the first capacitor.

12. The method of claim 10, further comprising, when the pass switch is in the ON state, controlling the pass switch so that an output node of the pass switch has a voltage level based on a voltage level of an input node of the pass switch.

13. The method of claim 10, wherein controlling the node of the one side of the first capacitor to have the first off-state level of voltage comprises, when the pass switch is in the OFF steady state, controlling nodes of both sides of the first capacitor to have the first off-state level of voltage.

14. A method of controlling a pass switch, comprising:
controlling a node of one side of a first capacitor to have a first level of voltage when a voltage of a control node of a pass switch is in a first state;
connecting the control node of the pass switch with the node of the one side of the first capacitor in response to an input control signal;
causing a change of a voltage of the control node of the pass switch from the first state to a second state;
when the voltage of the control node of the pass switch is in the second state, controlling a node of one side of a second capacitor to have a second level of voltage; and
in order to activate a second switch connected to the control node of the pass switch and any one of input and output nodes of the pass switch, causing a connection of the node of the one side of the second capacitor with the control node of the second switch by activating a third switch connected to a control node of the second switch.

15. The method of claim 14, further comprising, when the node of the one side of the second capacitor is connected with the control node of the second switch by the third switch, causing a change of the voltage of the control node of the pass switch from the second state to the first state due to activation of the second switch.

16. The method of claim 14, wherein causing a connection of the node of the one side of the second capacitor with the control node of the second switch comprises promoting a change in a voltage of the control node of the second switch by charge sharing between the second capacitor and a parasitic capacitance of the control node of the second switch.

17. The method of claim 10, further comprising:
when the voltage of the control node of the pass switch changes from the first state to the second state, maintaining a voltage between the control node of the pass switch and a first node, which is any one of input and output nodes, to be a reference voltage by using a resistor connected between the control node of the pass switch and the first node and a current source connected to the control node of the pass switch in response to the input control signal.

* * * * *